(12) United States Patent
Oh et al.

(10) Patent No.: US 7,450,398 B2
(45) Date of Patent: Nov. 11, 2008

(54) PRINTED CIRCUIT BOARD

(75) Inventors: Byoung-Ha Oh, Yongin-si (KR); Hwa-Jin Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/489,900

(22) Filed: Jul. 20, 2006

(65) Prior Publication Data

US 2007/0165390 A1 Jul. 19, 2007

(30) Foreign Application Priority Data

Dec. 2, 2005 (KR) ................. 10-2005-0116756

(51) Int. Cl.
 *H05K 1/11* (2006.01)
 *H05K 1/14* (2006.01)
(52) U.S. Cl. ............... 361/792; 361/749; 361/785; 361/789
(58) Field of Classification Search ............. 361/744, 361/784, 749–750, 807–810; 439/77; 257/686; 174/254

See application file for complete search history.

(56) References Cited

U.S. PATENT DOCUMENTS

| 5,241,454 A | * | 8/1993 | Ameen et al. ............... 361/744 |
| 5,461,202 A | * | 10/1995 | Sera et al. .................... 174/254 |
| 5,717,556 A | * | 2/1998 | Yanagida ..................... 361/803 |
| 5,933,343 A | * | 8/1999 | Lu et al. ...................... 363/144 |
| 5,936,850 A | * | 8/1999 | Takahashi et al. ........... 361/784 |
| 5,973,927 A | * | 10/1999 | Tanaka ........................ 361/760 |
| 5,995,370 A | * | 11/1999 | Nakamori .................... 361/704 |
| 6,051,878 A | * | 4/2000 | Akram et al. ................ 257/686 |
| 6,175,509 B1 | * | 1/2001 | Koch ........................... 361/809 |
| 6,223,973 B1 | * | 5/2001 | Wong et al. ............... 228/180.1 |
| 6,404,647 B1 | * | 6/2002 | Minne ......................... 361/760 |
| 6,404,648 B1 | * | 6/2002 | Slupe et al. ................. 361/760 |
| 6,617,528 B2 | * | 9/2003 | Armezzani et al. .......... 174/263 |
| 6,617,671 B1 | * | 9/2003 | Akram ........................ 257/668 |
| 7,003,623 B2 | * | 2/2006 | Teng ........................... 711/104 |
| 7,033,187 B2 | * | 4/2006 | Wu et al. ....................... 439/77 |
| 2005/0174698 A1 | * | 8/2005 | Matsuda et al. .......... 360/264.7 |
| 2006/0032669 A1 | * | 2/2006 | Kawakami et al. .......... 174/261 |
| 2006/0036872 A1 | * | 2/2006 | Yen .............................. 713/183 |
| 2006/0220201 A1 | * | 10/2006 | Liu et al. ..................... 257/679 |

* cited by examiner

*Primary Examiner*—Tuan T Dinh
(74) *Attorney, Agent, or Firm*—Mills & Onello, LLP

(57) ABSTRACT

An improved printed circuit board (PCB) includes first and second substrates, which are disposed being distanced or spaced mutually and in which at least one or more semiconductor chips are mounted, and a signal transmission part for providing a signal transmission path between the first and second substrates, the signal transmission part being extended out of a region having a size smaller than a maximum size of the first substrate within the first substrate, and being extended in the second substrate. In disposing two substrates in a spaced-apart structure of upper and lower positions, a length of flexible printed circuit (FPC) connecting the two substrates can be reduced, and an impedance mismatching caused in use of the FPC can be reduced.

17 Claims, 12 Drawing Sheets

PRINTED CIRCUIT BOARD

RELATED APPLICATIONS

This application relies for priority on Korean Patent Application No. 10-2005-0116756, filed in the Korean Intellectual Property Office on Dec. 2, 2005, the contents of which are incorporated herein in their entirety by reference.

BACKGROUND AND SUMMARY

1. Technical Field

The present invention relates to a printed circuit board (PCB), and more particularly, to a PCB having a flexible printed circuit.

2. Description

In general, in a printed circuit board (PCB), circuit patterns to electrically connect electronic parts are formed to mount several electronic parts on a flat plate made of phenolic rosins or epoxy rosins etc.

The PCB may be fabricated in a structure having one pattern layer, but may also be fabricated in a laminated multilayer structure. When the PCB requires a capacitance increase in the presence of a spatial limitation, a flexible printed circuit (FPC) is used and a plurality of PCBs are used and are connected mutually.

The FPC transfers signals outputted from a PCB to an external circuit or device, and/or signals outputted from the external circuit or device to the PCB. The external circuit or device may be one or more other PCBs. The FPC is used for a multiplicity of purposes, as a substrate in which a large number of printed wires are arrayed on one face or both faces of the thinned insulation substrate having flexibility.

For example, the FPC allows numerous wires to be arrayed in a high density fashion and can be made in a thin configuration and can be readily installed in a small space due to its flexibility. The FPC also allows an electrical connection between mutually moving units.

A PCB according to prior art will be described referring to the drawings.

FIG. 1 is a perspective view schematically illustrating an example of a PCB having an FPC according to prior art.

Referring to FIG. 1, a first substrate 10, a second substrate 20 and a flexible printed circuit (FPC) are shown.

In the first substrate 10, various electronic parts, e.g., a micro control unit (MCU) and a plurality of semiconductor chips 11-14 etc., are mounted. That is, patterns for the mounting of the MCU and the plurality of semiconductor chips 11-14 are formed in the first substrate 10.

In the second substrate 20, patterns for mounting a plurality of semiconductor chips 21-28 are formed. The second substrate 20 is connected to the first substrate 10 through the FPC.

The FPC is projected from each edge portion of the first and second substrates 10 and 20, to connect the first substrate 10 with the second substrate 20. The FPC provides a signal transmission path between the first substrate 10 and the second substrate 20. The FPC is provided as the signal transmission path between the MCU and the semiconductor chips 11-14 mounted on the first substrate 10 and the semiconductor chips 21-28 mounted on the second substrate 20. In the connected state of the FPC connected to the first substrate 10 or the second substrate 20, the FPC is flexible.

For example, in the first substrate 10 and the second substrate 20 connected through the FPC within a device having a small area, the second substrate 20 may be disposed being spaced from an upper part of the first substrate 10 by a predetermined distance. This example configuration is shown in FIG. 2.

FIG. 2 is a perspective view illustrating a second substrate 20 spaced from an upper part of first substrate 10 shown in FIG. 1.

With reference to FIG. 2, the second substrate 20 connected to the first substrate 10 is spaced a predetermined distance from an upper part of the first substrate 10 through the FPC.

The spaced disposition of the second substrate 20 from the upper part of the first substrate 10 can reduce the area occupied by the PCB.

FIG. 3 is a sectional view taken along a line A1 to A2 shown in FIG. 1, and FIG. 4 is a sectional view of the spaced disposition between the first and second substrates 10 and 20.

Referring to FIGS. 3 and 4, the first and second substrates 10 and 20 are respectively formed of a plurality of pattern layers. The FPC is associated with each layer of the first and second substrates 10 and 20.

Electronic parts are mounted on one face of a first pattern layer L1 of the first substrate 10. The FPC is formed under the first pattern layer L1 to obtain signal transmission with electronic parts mounted on the first substrate 10. An insulation layer 42 is formed between the first pattern layer L1 and the FPC, to be electrically isolated therefrom.

A third pattern layer L3 is formed under the FPC. An insulation layer 44 is formed between the FPC and the third pattern layer L3, to be electrically isolated therefrom. Electronic parts are mounted on one face of the third pattern layer L3. Contact parts formed in the insulation layers 42 and 44 to obtain a signal transmission between pattern layers are not closely related to the present invention, thus they are not shown in the drawings.

The second substrate 20 is formed of a plurality of pattern layers, and the FPC serves as one layer of the plurality of pattern layers as a second pattern layer.

With reference to FIG. 4, in disposing the second substrate 20 spaced from an upper part of the first substrate 10, to prevent a mutual interference between electronic parts mounted on the first and second substrates 10 and 20 or to provide isolation therebetween, an insulation jig is disposed between the first and second substrates 10 and 20, though not shown in the drawings.

Though herein described as an example that the respective first and second substrates 10 and 20 are formed of three-layer structures, it may be formed of the structure of four or more layers.

As described above, in a conventional printed circuit board, the FPC is projected from respective edge portions of the substrates connected mutually through the FPC.

This causes difficulty in reducing a length of the FPC in connecting and disposing one substrate over another substrate.

Such an FPC causes unacceptable impedance matching in the device employing the PCB, and particularly, the impedance matching becomes more difficult when a length of the FPC is increased relatively.

FIG. 5 is a sectional view schematically illustrating an example of a device employing a PCB.

In FIG. 5, the PCB is built in a case or housing 54 of the device employing the PCB.

The PCB is constructed of a first substrate 50 and a second substrate 52 that is connected to the first substrate 50 through the FPC and that is disposed spaced from an upper part of the first substrate 50. Electronic parts (not shown) are mounted on one face or both faces of the respective first and second substrates 50 and 52.

As shown in FIG. 5, when the case 54 of the device employing the PCB has a protuberance 56, and if the FPC is projected from edge portions of the first and second substrates 50 and 52, a length of the FPC should be increased. The length increase of the FPC worsens the impedance mismatching or causes other difficulties.

In particular, signal distortion from the impedance mismatching also causes a setup/hold failure in various signals or a false decision of input level etc.

Hence, to reduce the impedance mismatching it is required to reduce the length of FPC.

SUMMARY OF THE INVENTION

Accordingly, one exemplary embodiment of the invention provides a printed circuit board, which is capable of solving the problems associated with a flexible printed circuit (FPC) projected from and connected with edge portions of substrates in the conventional PCB. A length of FPC connected between two substrates can be reduced in upper and lower positions where the two substrates are installed. The FPC is projected from edge portions of the two substrates, to connect the two substrates, solving the problem of increased length of the FPC. An impedance mismatching in the FPC connecting the two substrates is substantially reduced. A setup/hold fail or false decision of input level etc. caused by signal distortion of the impedance mismatching is substantially reduced.

According to one aspect, the invention is directed to a printed circuit board (PCB), comprising spaced-apart first and second substrates. A signal transmission element connects the first and second substrates. The signal transmission element is extended out of a region having a size smaller than a maximum size of the first substrate within the first substrate, and signal transmission element is extended in the second substrate.

In one embodiment, the second substrate is disposed being spaced apart from an upper part of the first substrate.

In one embodiment, the first and second substrates have a pattern formation for which at least one electronic part is mounted. In one embodiment, the signal transmission element provides a path of signal transmission between electronic parts mounted on the first and second substrates.

In one embodiment, the signal transmission element is extended through an opening part formed in the first substrate.

In one embodiment, the first and second substrates are formed of a plurality of pattern layers. In one embodiment, the signal transmission element is united with any of one or more pattern layers of the first substrate and any of one or more pattern layers of the second substrate. In one embodiment, the electronic parts are semiconductor chips.

In one embodiment, the printed circuit board (PCB) is used in a device selected from a hard disk drive (HDD), a solid state disk (SSD) and a memory stick.

According to another aspect, the invention is directed to a PCB comprising first and second substrates that are disposed being distanced from each other and that each have at least one electronic part. A signal transmission element provides a signal transmission path between the first and second substrates, the signal transmission element being extended out of a region having a size smaller than a maximum size of the first substrate within the first substrate, and being extended in the second substrate.

In one embodiment, the signal transmission element is a flexible printed circuit.

In one embodiment, the second substrate is disposed a distance from an upper part of the first substrate.

In one embodiment, the signal transmission element is projected along a first direction of the signal transmission element through an opening part formed in a region having a size smaller than a maximum size of the first substrate within the first substrate.

In one embodiment, the PCB further comprises an insulation jig for providing insulation between the first and second substrates. In one embodiment, the insulation jig is an insulation pin that pierces through and is fastened to the first and second substrates so as to dispose the first substrate distanced from the second substrate and to maintain the distanced state.

According to another aspect, the invention is directed to a PCB having a mutually distanced structure of first and second substrates through use of a signal transmission element, wherein the second substrate is disposed over the first substrate, the signal transmission element is extended out of a region having a size smaller than a maximum size of the first substrate within the first substrate, and the signal transmission element is extended out of a region having a size smaller than a maximum size of the second substrate within the second substrate.

In one embodiment, the first and second substrates are formed of a plurality of pattern layers, and any of one or more pattern layers of the first substrate and any of one or more pattern layers of the second substrate are united with the signal transmission element. In one embodiment, any of one or more pattern layers of the first substrate, any of one or more pattern layers of the second substrate and the signal transmission element are a flexible printed circuit.

In one embodiment, the PCB is used in a device selected from an HDD, an SSD and a memory stick.

According to another aspect, the invention is directed to a PCB, comprising one substrate on which at least one electronic part is mounted. A signal transmission element provides a signal transmission path of the substrate, the signal transmission element being extended out of a region having a size smaller than a maximum size of the substrate within the substrate.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION

Hereinafter, exemplary embodiments of the present invention will be described in detail with reference to FIGS. 6 to 12. It will be understood by those skilled in the art that the present invention can be embodied in numerous different ways and is not limited to the following described embodiments. The following various embodiments are exemplary in nature.

Figure 6:
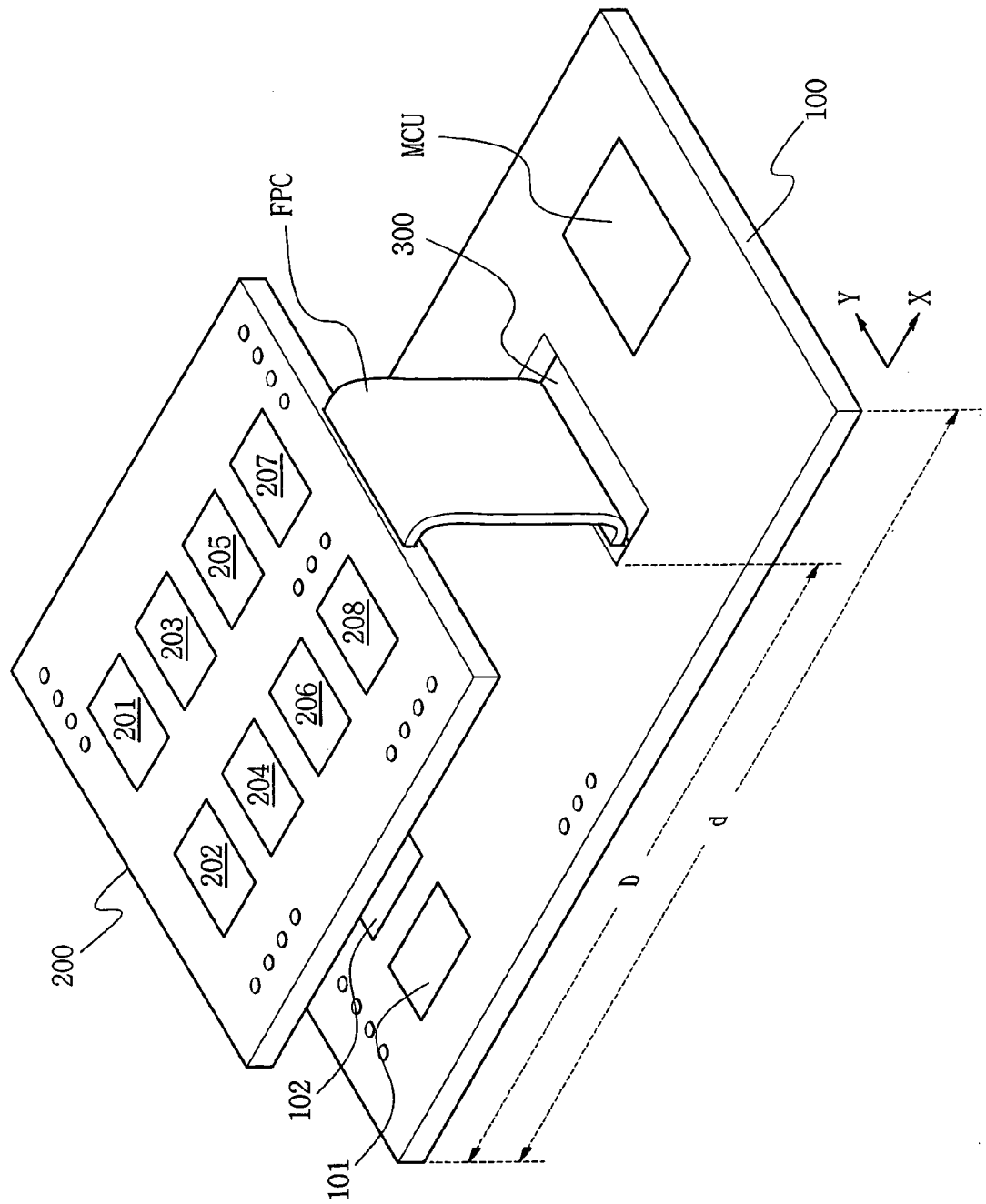
FIG. 6 is a perspective view schematically illustrating a PCB according to one exemplary embodiment of the invention.
Figure 7:
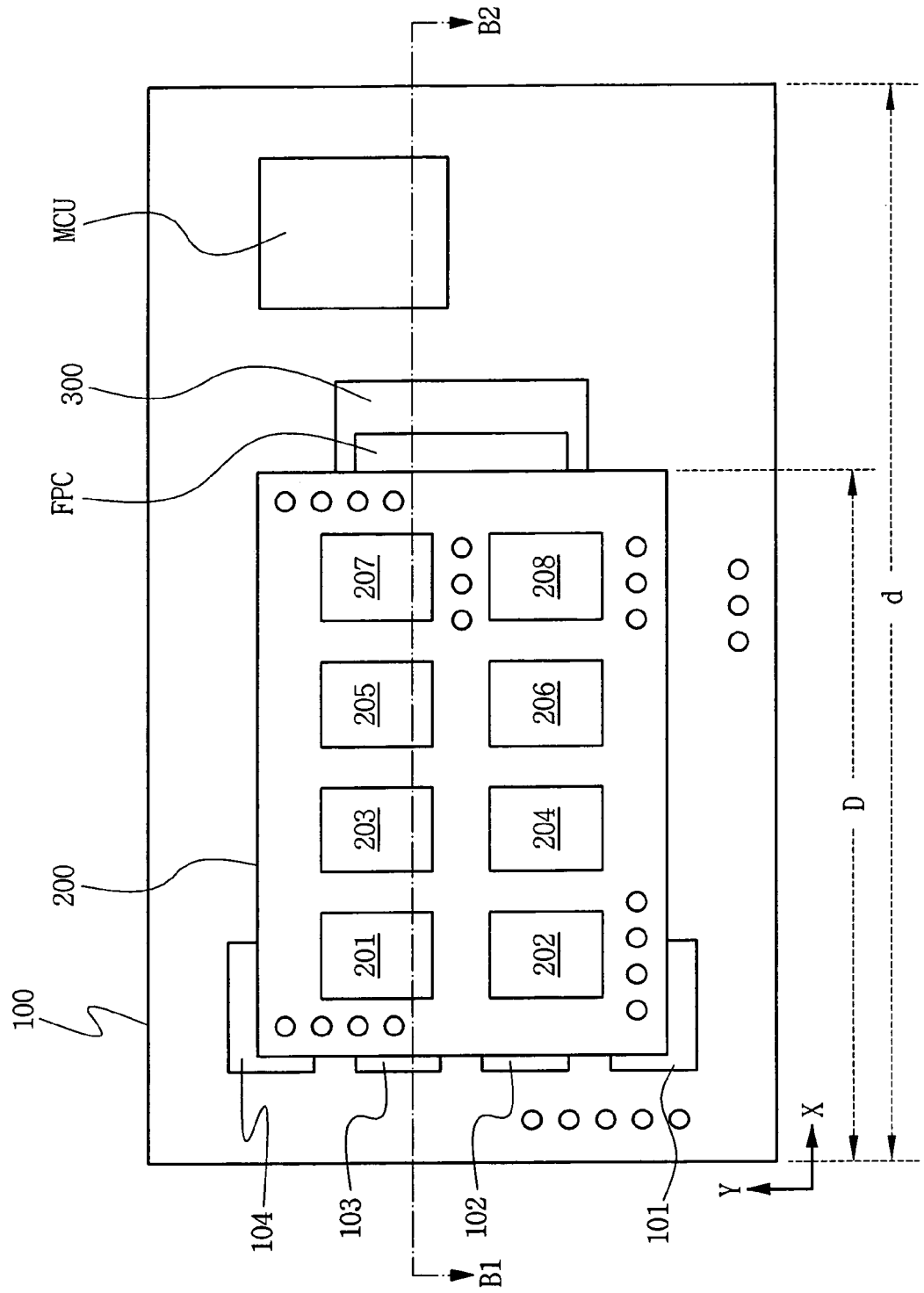
FIG. 7 is a plan view of the PCB shown in FIG. 6.

FIG. 6 is a perspective view schematically illustrating a PCB according to one exemplary embodiment of the invention. FIG. 7 is a plan view of the PCB shown in FIG. 6, and FIG. 8 is a side view of the PCB shown in FIG. 6.

Figure 8:
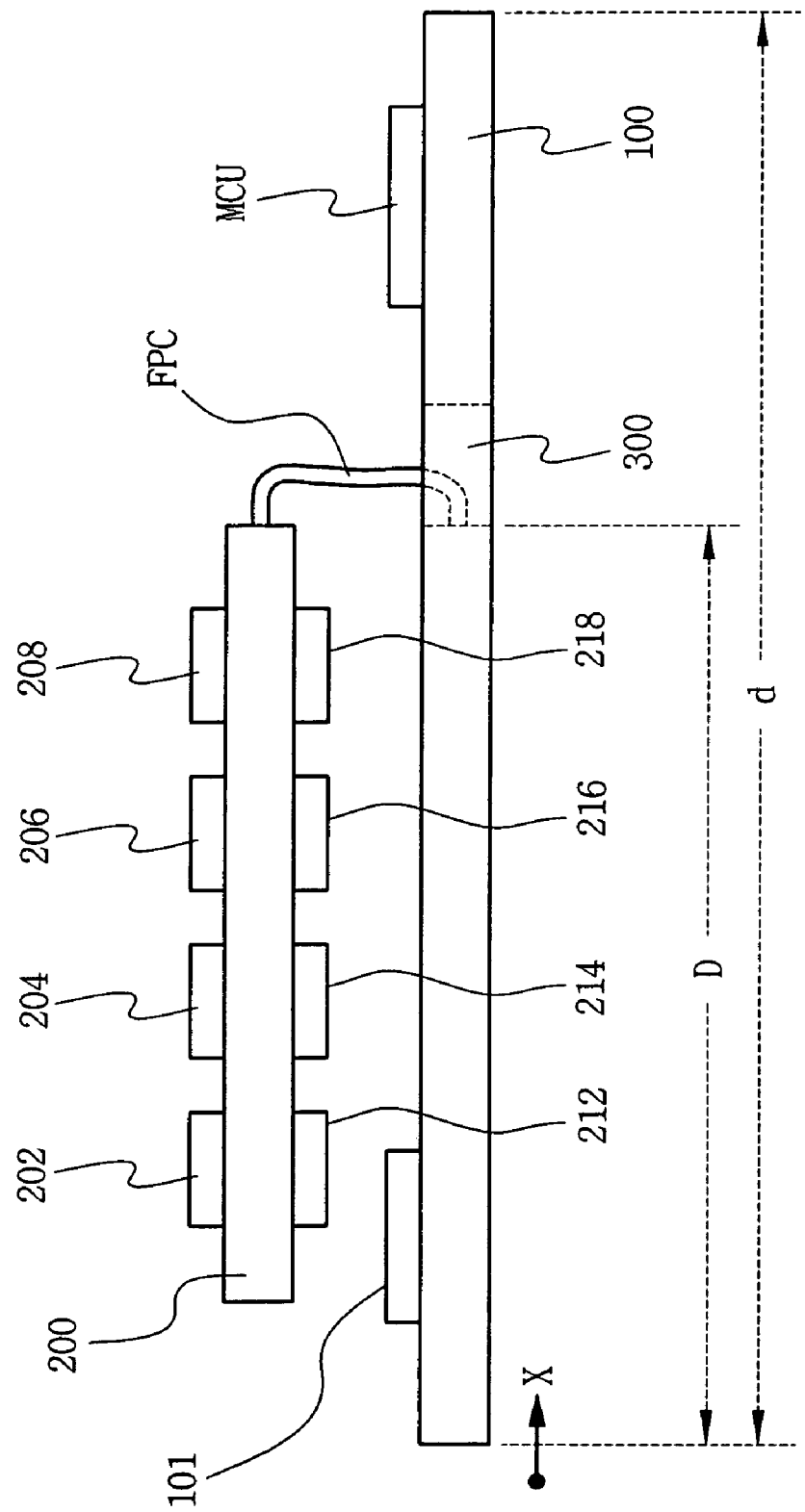
FIG. 8 is a side view of the PCB shown in FIG. 6.

Referring to FIGS. 6 to 8 illustrating a first substrate 100, a second substrate 200 and a signal transmission FPC, a PCB according to an exemplary embodiment of the invention has a mutually spaced structure of first and second substrates 100 and 200 through the use of the signal transmission FPC.

Various electronic parts, e.g., a micro control unit MCU and semiconductor chips 101-104 etc., may be mounted on the first substrate 100. Thus, patterns for the mounting of the MCU and the semiconductor chips 101-104 are formed in the first substrate 100. The electronic parts 101-104 may be various semiconductor devices such as a NAND flash memory, a RAM (Random Access Memory) etc.

Likewise, electronic parts 201-208 may be mounted on the second substrate 200. in general, the electronic parts 201-208 mounted on the second substrate 200 may be the same electronic parts having the same function as the electronic parts 101-104 mounted on the first substrate 100, or may be electronic parts having other functions.

The signal transmission FPC is extended out of a region having a size D smaller than a maximum size (d) of the first substrate 100, within the first substrate 100, along a first direction of the signal transmission as an X axis direction. The signal transmission FPC is extended in the second substrate 200, to provide a signal transmission path between the first and second substrates 100 and 200. The signal transmission FPC is the flexible printed circuit. Though the first direction of the signal transmission portion was herein described as the X axis direction, the first direction of signal transmission portion may be a Y axis direction.

The first substrate 100 may further include an opening portion 300 formed as a region having a size D smaller than a maximum size (d) of the first substrate 100 within the first substrate 100, along a first direction of the signal transmission portion as an X-axis direction.

The signal transmission portion FPC may be extended through the opening portion 300. There is no limitation for a size of the opening portion 300. The opening portion 300 should be formed in a portion where a pattern is not formed in the first substrate 100, and provides a space where the signal transmission portion FPC can be drawn out.

The second substrate 200 may be disposed spaced apart from an upper part of the first substrate 100, thus a limited area of the device using the PCB can be applied thereto. In this case, beneficially, the PCB may further include an insulation jig (not shown) to insulate between the first substrate 100 and the second substrate 200. The insulation jig prevents signal interference between electronic parts mounted on the first and second substrates 100 and 200, and provides insulation therebetween.

For example, the insulation jig (not shown) may be a double-sided adhesive tape having an insulation function, and may be an insulation pin (not shown) that pierces through and is fastened to the first substrate 100 and the second substrate 200, to maintain a distanced layout of the first substrate 100 from the second substrate 200. To obtain the fastening with the insulation pin, a hole through which the insulation pin can pierce is formed at a portion where a pattern is not formed, in the respective first and second substrates 100 and 200.

Figure 1:
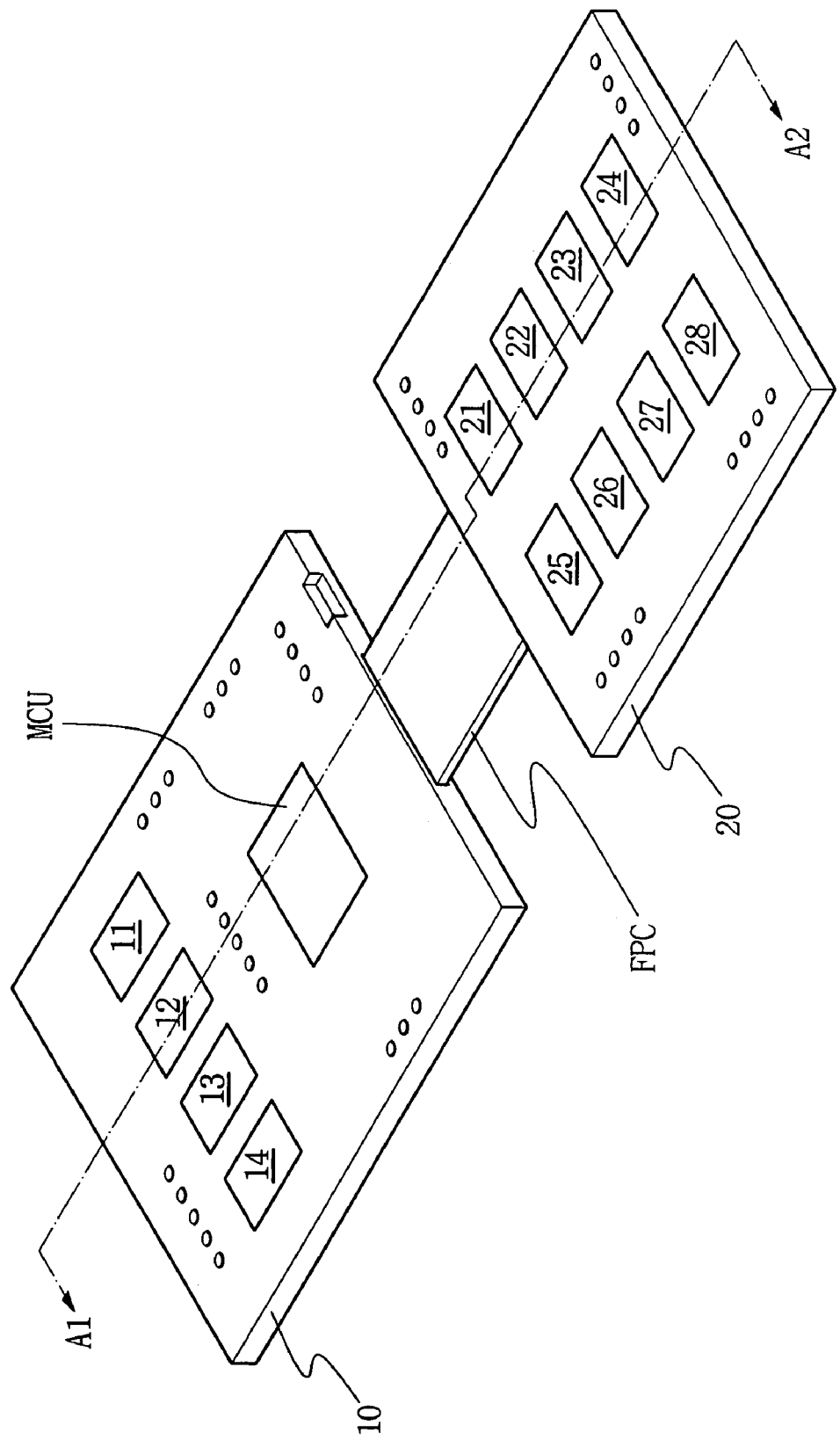
FIG. 1 is a perspective view schematically illustrating an example of PCB having an FPC according to prior art.
Figure 2:
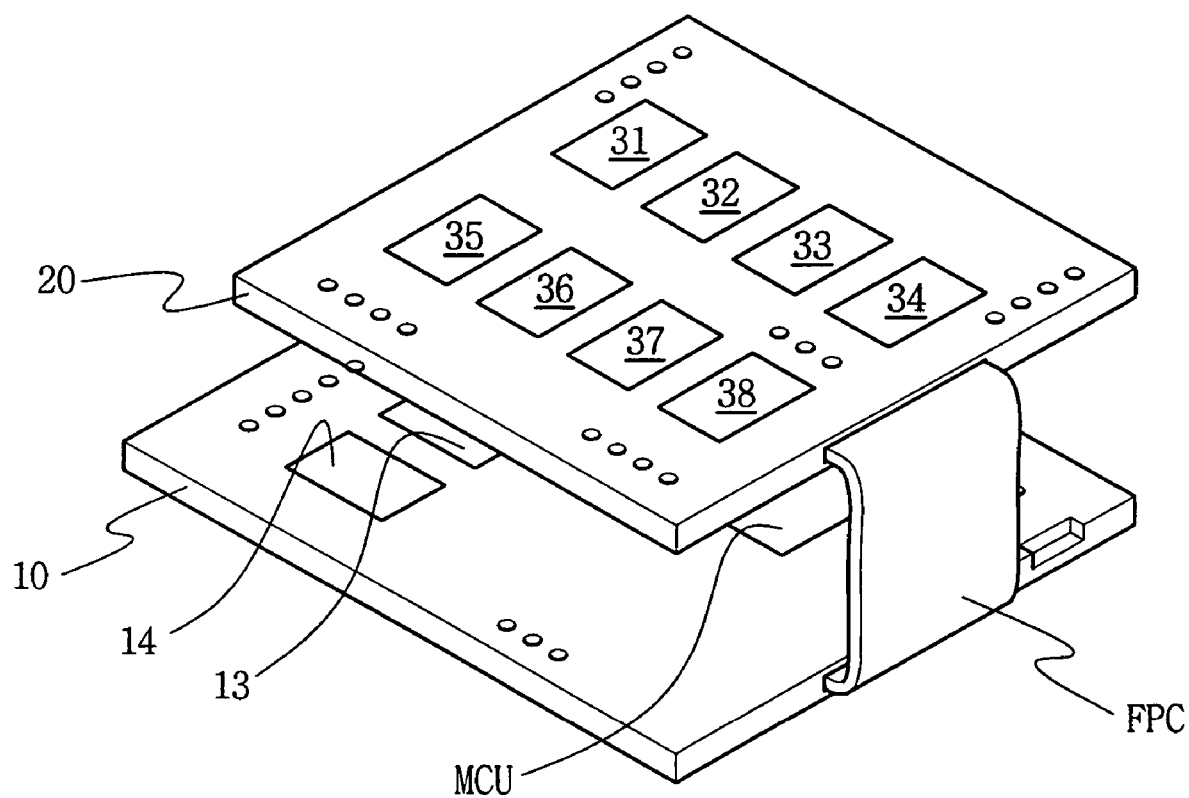
FIG. 2 is a perspective view schematically illustrating a mutually spaced layout of first and second substrates shown in FIG. 1.
Figure 3:
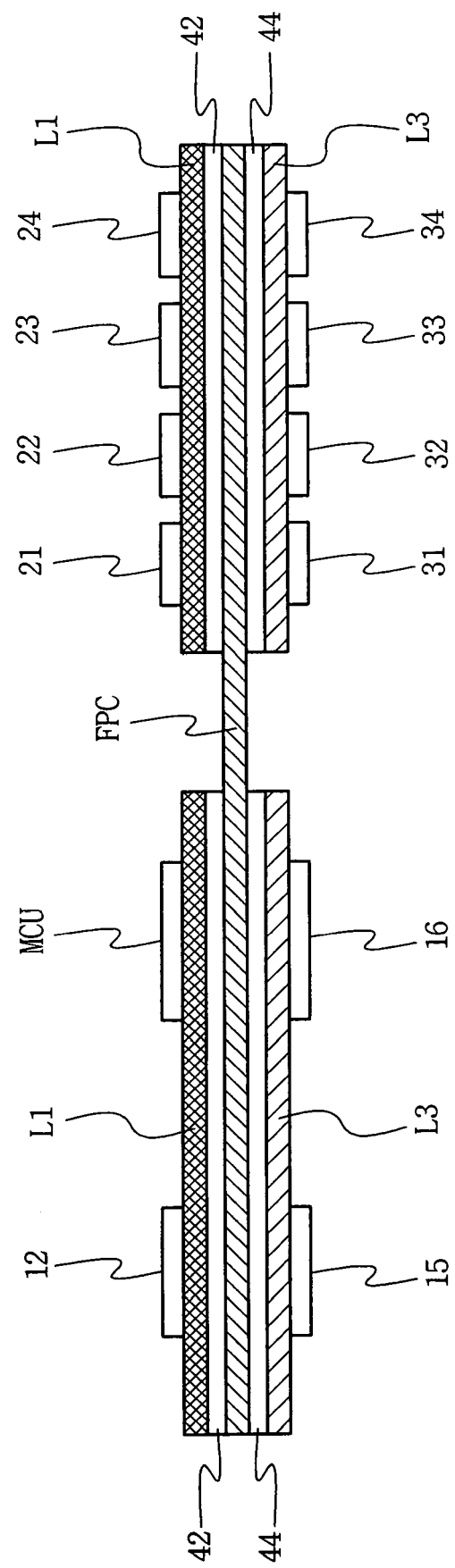
FIG. 3 is a sectional view taken along a line A1, A2 shown in FIG. 1.
Figure 4:
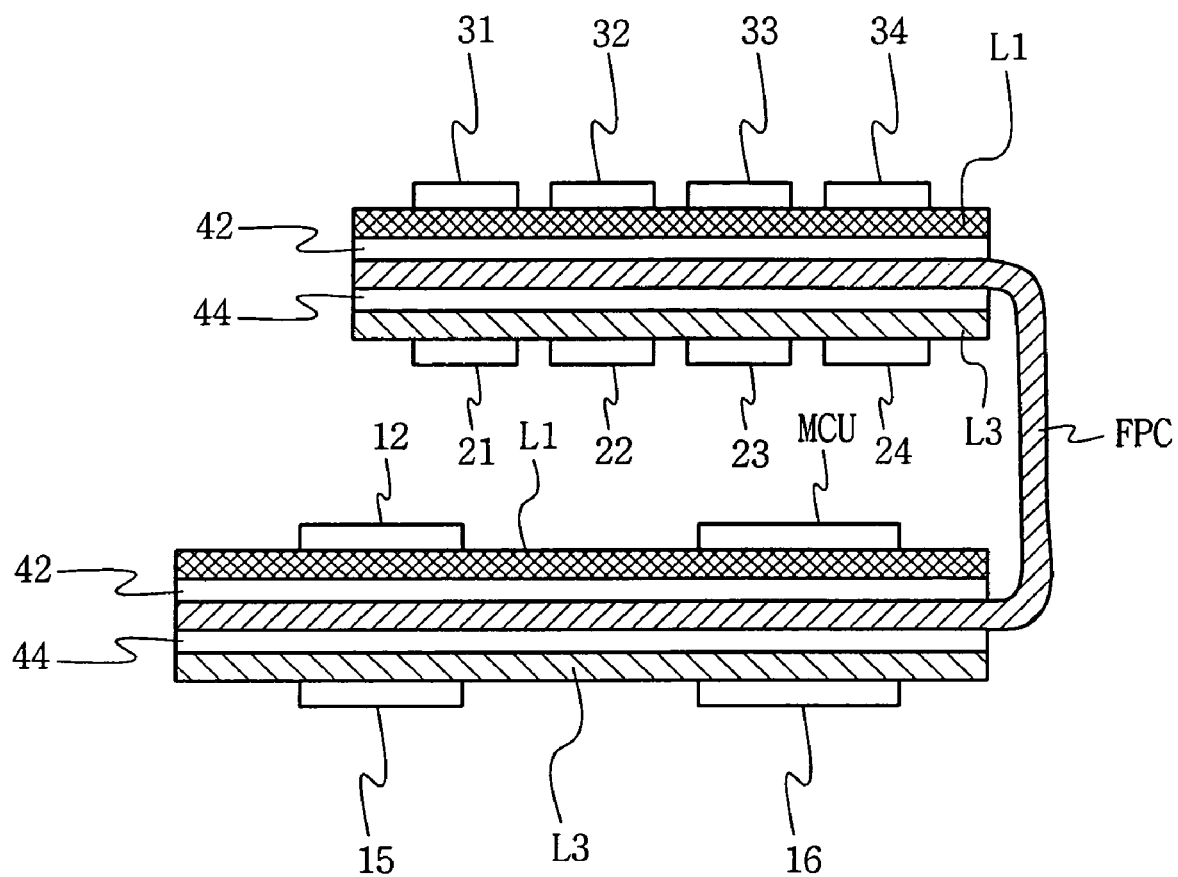
FIG. 4 is a sectional view illustrating a mutually spaced layout of a second substrate over a first substrate shown in FIG. 1.
Figure 5:
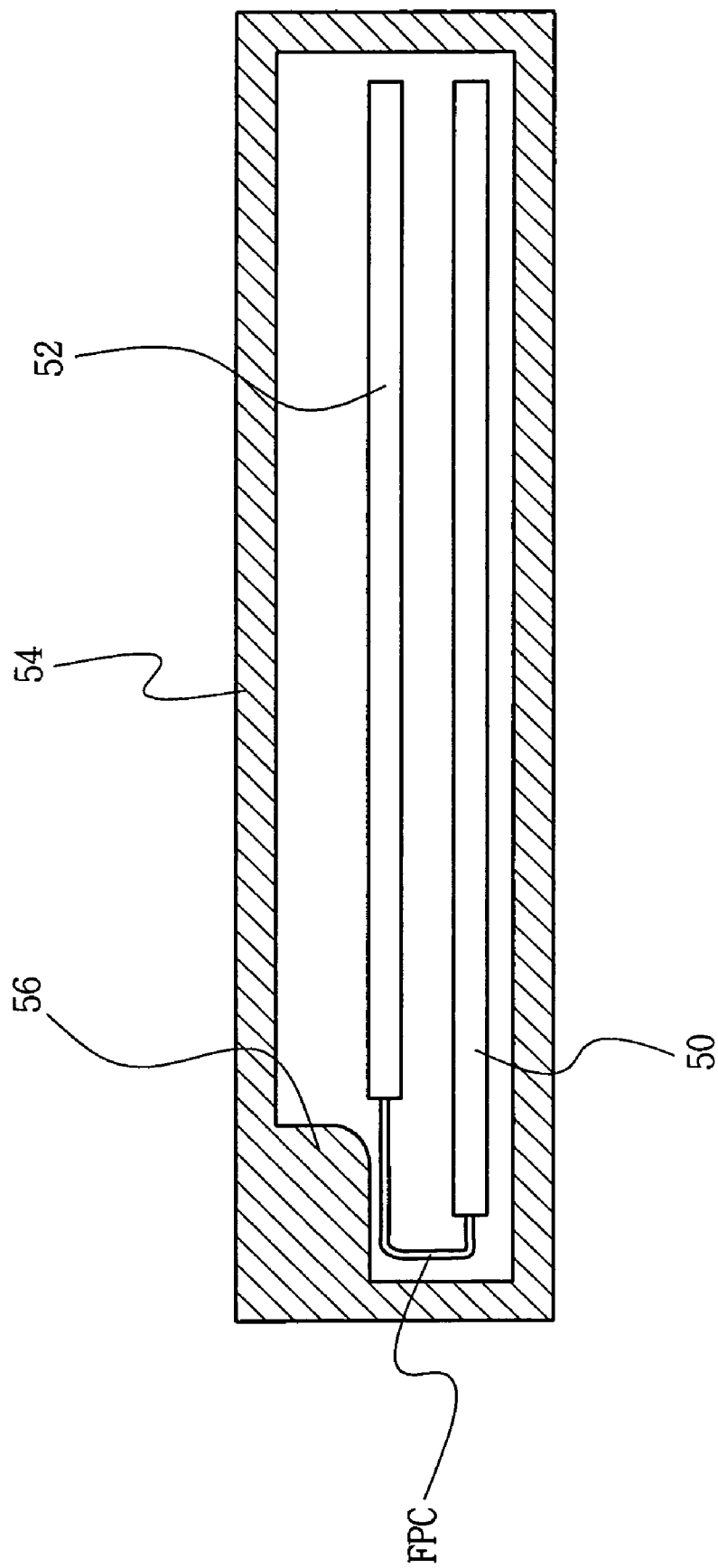
FIG. 5 is a sectional view schematically illustrating an example of a device employing a PCB of FIG. 1.

In comparing the PCB according to one exemplary embodiment of the invention with the conventional PCB referred to in FIG. 1, a length of the signal transmission portion FPC is substantially reduced in the PCB according to one exemplary embodiment of the invention.

That is, under the assumption of the same distanced-layout condition of the first and second substrates 100 and 200, a length of the FPC according to an exemplary embodiment of the invention is substantially reduced as compared with the conventional case in which the FPC shown in FIG. 1 is drawn out of an edge portion of the substrate. Thus an impedance mismatching problem caused by a high length of the FPC can be reduced.

The impedance mismatching may occur by various causes, e.g., external noise or a variation of power source voltage or a change of operating temperature or fabricating process, etc. When the impedance mismatching occurs, it is difficult to transmit data at high speed. Furthermore, a signal outputted from a data output terminal of a device having the impedance mismatching may be distorted. That is, a setup/hold fail or false decision of input level, etc. may be caused by the distorted output signal in the device having impedance mismatching.

Accordingly, in the PCB according to one exemplary embodiment of the invention, a length of the signal transmission portion FPC is reduced, thereby solving the problems of conventional devices.

Figure 9:
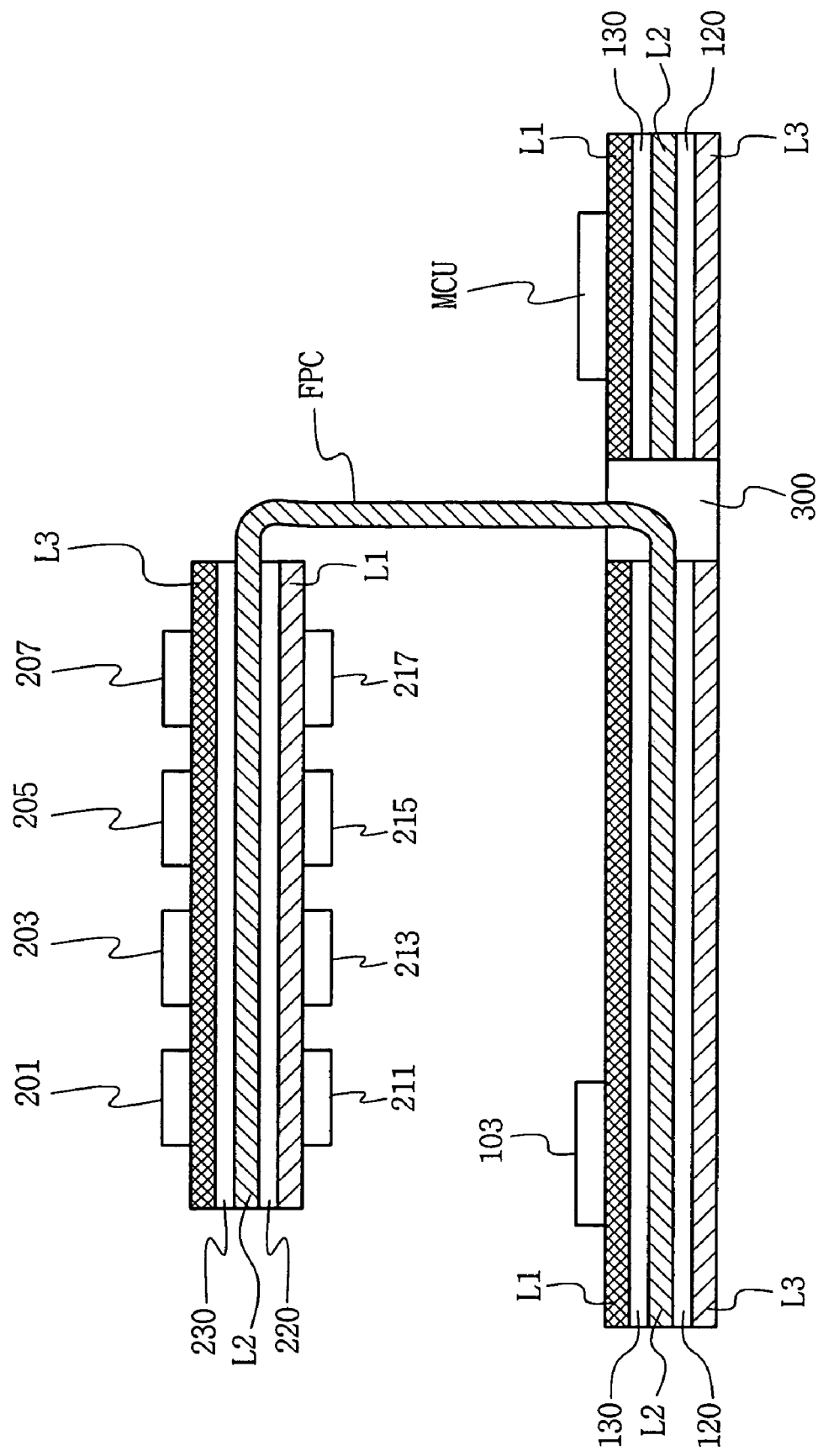
FIG. 9 is a sectional view taken along a line B1, B2 shown in FIG. 7.

FIG. 9 is a sectional view taken along a line B1, B2 shown in FIG. 7.

With reference to FIG. 9, a laminated structure of first and second substrates 100 and 200 is shown in detail in the PCB of FIG. 7.

The first substrate 100 may be formed of a plurality of pattern layers L1, L2 and L3. At least one or more electronic parts are mounted on one face of first pattern layer L1.

A second pattern layer L2 is formed under the first pattern layer L1, and an insulation layer 130 is formed between the first and second pattern layers L1 and L2.

A third pattern layer L3 is formed under the second pattern layer L2, and an insulation layer 120 is formed between the second and third pattern layers L2 and L3.

The insulation layer 120, 130 insulates between the first and second pattern layers L1 and L2, and between the second and third pattern layers L2 and L3, respectively. A contact for an electrical connection between the pattern layers L1, L2 and L3 in the insulation layer 120, 130 is not closely related to the present invention, thus is not shown in the drawing. More electronic parts may be mounted on the third pattern layer L3.

The first substrate 100 may further include an opening part 300 formed in a region having a size D smaller than a maximum size (d) of the first substrate 100.

The second substrate 200 is also formed of first, second and third layers L1, L2 and L3, like the laminated structure of the first substrate 100.

The second pattern layer L2 of each of the first and second substrates 100 and 200 is formed with the signal transmission part FPC. That is, the signal transmission part FPC is united with the second pattern layer L2 of the first substrate 100, and is extended through the opening part 300. the signal transmission part FPC is united with the second pattern layer L2 of the second substrate 200, and is extended out of the one side of the second substrate 200.

The second pattern layer L2 of the respective first and second substrates 100 and 200 may be formed of a flexible printed circuit, like the signal transmission part FPC.

In the PCB according to an exemplary embodiment of the invention, a length of signal transmission part FPC connecting between substrates is reduced as compared with the conventional PCB. That is, an impedance mismatching can be reduced in the device employing the PCB.

It was described above in the exemplary embodiment of the invention that the first and second substrates 100 and 200 are formed of three pattern layers, and the signal transmission part FPC is united with any one pattern layer L2 of each of the first and second substrates 100 and 200; but the first and second substrates 100 and 200 may be formed of four or more pattern layers. Also the signal transmission part FPC may be united with two or more pattern layers.

Figure 10:
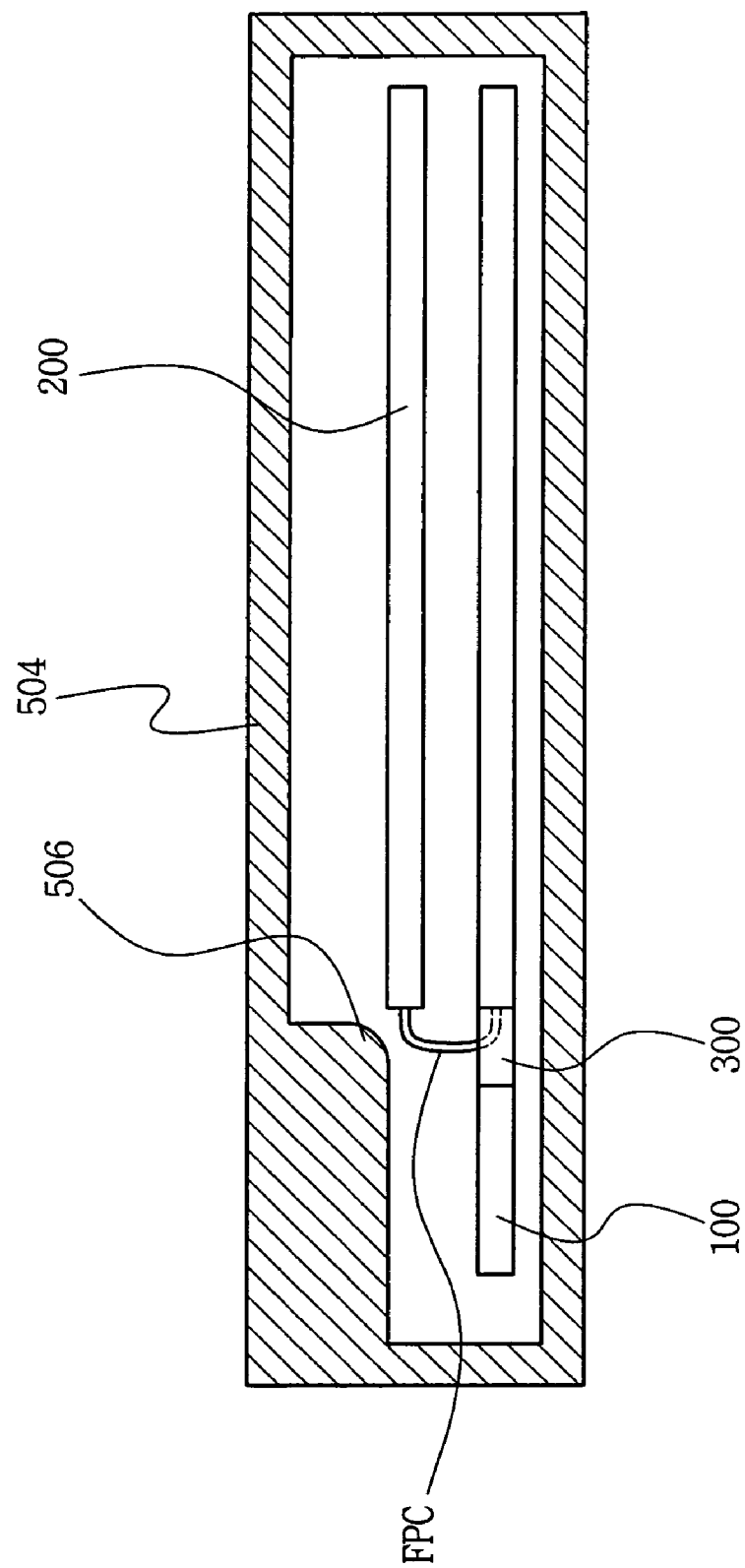
FIG. 10 is a sectional view schematically illustrating an example of a device employing the PCB of FIG. 6.

FIG. 10 is a sectional view schematically illustrating an example of a device employing a PCB of FIG. 6.

FIG. 10 illustrates the PCB built in the device.

In case a projection part 506 is formed in a case 504 of the device employing the PCB, in a conventional PCB the second substrate 200 cannot be moved to an edge portion of the first substrate 100, thus it is difficult to reduce a length of the signal transmission part FPC. Thus the length of signal transmission part FPC must be inevitably lengthened.

However, in a PCB according to an exemplary embodiment of the invention, the signal transmission part FPC is projected through the opening part 300 of the first substrate, then is connected to the second substrate. That is, the length of the signal transmission part FPC is substantially reduced, solving an impedance mismatching problem.

The PCB according to an exemplary embodiment of the invention can be applied to storage media such as a hard disk drive (HDD), solid state disk (SSD), memory stick etc. or various devices employing a PCB.

The SSD is a large-capacity data storage device constructed of NAND flash memory, that is, a next-generation data storage device obtained by eliminating a motor and a mechanical drive device necessary for the conventional hard disk drive therefrom, in which heat and noise are hardly generated and which is resistant to outside impact. The memory stick is a storage device which is capable of storing various data such as characters and moving images etc. at a flash memory of small size, and is frequently used in various kinds of digital devices etc.

Accordingly, the PCB according to an exemplary embodiment of the invention can be necessarily employed in the device to store a large capacity of data.

Figure 11:
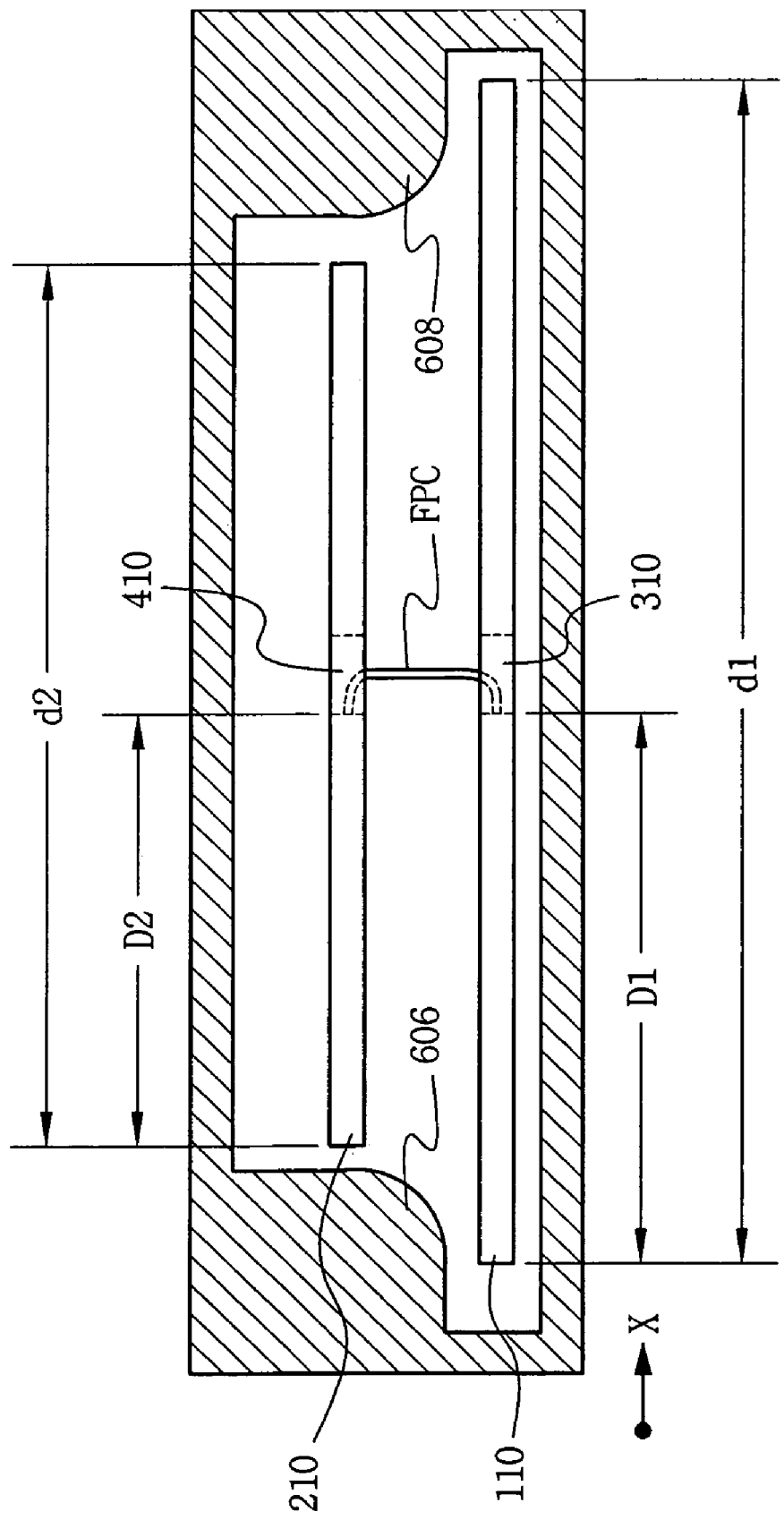
FIG. 11 is a sectional view illustrating another exemplary embodiment of the invention.

FIG. 11 is a sectional view providing another exemplary embodiment of the invention.

FIG. 11 illustrates a PCB including a first substrate 110, a second substrate 210 and a signal transmission part FPC, and a case 604 of a device employing the PCB.

In each of the first and second substrates 110 and 210, at least one or more electronic parts (not shown) may be mounted. The respective first and second substrates 110 and 210 may be formed to have a plurality of pattern layers.

The signal transmission part FPC is extended out of a region having a size D1 smaller than a maximum size (d1) of the first substrate 110, along a first direction of the signal transmission part FPC, within the first substrate 110.

The signal transmission part FPC is extended out of a region having a size D2 smaller than a maximum size (d2) of the second substrate 210, along a first direction of the signal transmission part FPC, within the second substrate 210.

An insulation jig (not shown) is adapted between first and second substrates 110 and 210, to provide insulation therebetween.

The first and second substrates 110 and 210 may be formed of a plurality of pattern layers, and any one or more pattern layers of the first substrate 110 and any one or more pattern layers of the second substrate 210 may be united with the signal transmission part FPC.

Any one or more pattern layers of the first substrate 110, any one or more pattern layers of the second substrate 210 and the signal transmission part FPC may be a flexible printed circuit.

As shown in FIG. 11, in case a projection part 606, 608 is formed in a case 604 of a device employing the PCB, the FPC is projected from the inner side of first and second substrates 110 and 210, to connect the first substrate 110 with the second substrate 210. Thereby, a conventional problem caused by the protuberance of the signal transmission part FPC from an edge portion of the second substrate 210 can be solved, and an impedance mismatching can be reduced by reducing a length of the signal transmission part FPC.

The device may be HDD, SSD or a memory stick, and may be various types of devices employing a PCB.

Figure 12:
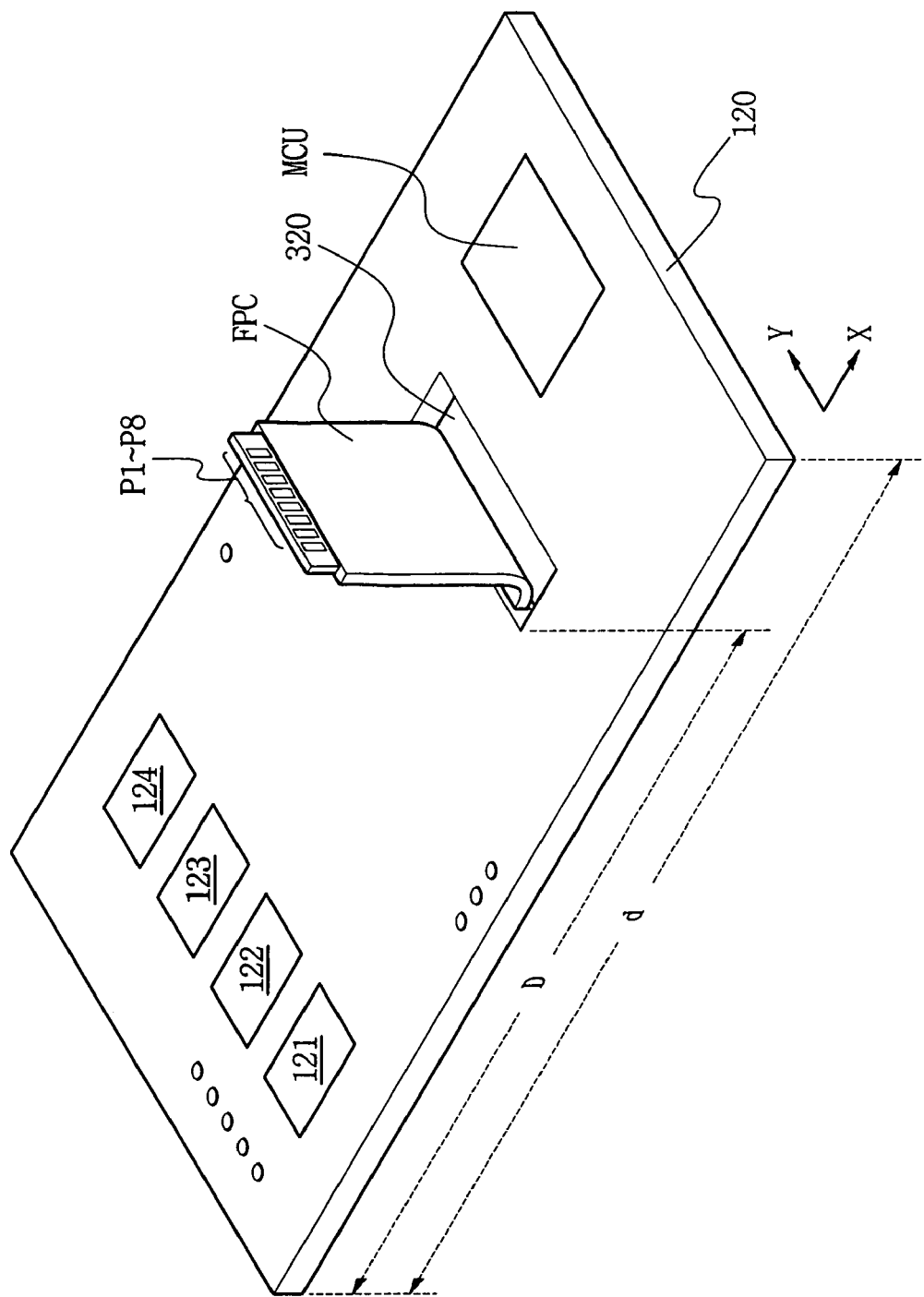
FIG. 12 is a perspective view illustrating another exemplary embodiment of the invention.

FIG. 12 is a perspective view providing another exemplary embodiment of the invention.

Referring to FIG. 12, a PCB according to another exemplary embodiment of the invention includes one substrate 120 and a signal transmission part FPC.

The one substrate 120 includes at least one electronic part, e.g., a micro control unit (MCU) and other semiconductor chips 121-124 etc.

The signal transmission part FPC provides a signal transmission path of the substrate 120. The signal transmission part FPC is extended out of a region having a size D smaller than a maximum size (d) of the substrate within the substrate 120, along a first direction of the signal transmission part FPC. The signal transmission part FPC includes signal transmission pins P1-P8 to transmit signals through an electrical connection between other devices (not shown) and the substrate 120. Thus, a length of the signal transmission part FPC can be controlled in the device employing the PCB.

Accordingly, a PCB according to another exemplary embodiment of the invention can solve problems caused by the protuberance of the signal transmission part FPC from an edge portion of substrate.

As described above, an improved PCB according to an exemplary embodiment of the invention solves problems caused from characteristics that a flexible printed circuit is projected from edge portion of substrates and is connected thereto in a conventional PCB.

In addition, an improved PCB according to an exemplary embodiment of the invention has an effect of reducing a length of flexible printed circuit for a connection of two substrates in disposing the two substrates at upper and lower positions.

Further, the improved PCB substantially reduces an impedance mismatching caused by a flexible printed circuit that connects between two substrates.

The improved PCB substantially reduces occurrence of problems such as a setup/hold fail or false decision of an input level etc. caused by a signal distortion of impedance mismatching.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A printed circuit board (PCB), comprising:
spaced-apart first and second substrates;
a substantially U-shaped signal transmission element connecting the first and second substrates; wherein
a first portion of the signal transmission element extends in a first direction from a region of the first substrate, the region having a size smaller than a maximum size of the first substrate; wherein
a second portion of the signal transmission element protrudes through an opening portion of the first substrate in a second direction that is different than the first direction, the opening portion adjacent to the region of the first substrate; and wherein
a third portion of the signal transmission element is extended in the second substrate.

2. The PCB of claim 1, wherein the second substrate is disposed being spaced apart from an upper part of the first substrate.

3. The PCB of claim 1, wherein the first and second substrates have a pattern formation for which at least one electronic part is mounted.

4. The PCB of claim 1, wherein the signal transmission element is extended out through an opening part formed in the first substrate.

5. The PCB of claim 1, wherein the first and second substrates are formed of a plurality of pattern layers.

6. The PCB of claim 1, wherein the printed circuit board (PCB) is used in a device selected from a hard disk drive (HDD), a solid state disk (SSD) and a memory stick.

7. The PCB of claim 3, wherein the signal transmission element provides a path of signal transmission between the at least one electronic part mounted on the first and second substrates.

8. The PCB of claim 3, wherein the at least one electronic part is a semiconductor chip.

9. The PCB of claim 5, wherein the signal transmission element is united with any of one or more pattern layers of the first substrate and any of one or more pattern layers of the second substrate.

10. A PCB comprising:
first and second substrates that are disposed being distanced from each other, each substrate having at least one electronic part; and
a substantially U-shaped signal transmission element for providing a signal transmission path between the first and second substrates; wherein:
a first portion of the signal transmission element extends in a first direction from a region of the first substrate, the region having a size smaller than a maximum size of the first substrate; wherein:
a second portion of the signal transmission element protrudes through an opening portion of the first substrate in a second direction that is different than the first direction, the opening portion adjacent to the region of the first substrate; and wherein
a third portion of the signal transmission element is extended in the second substrate.

11. The PCB of claim 10, wherein the signal transmission element is a flexible printed circuit.

12. The PCB of claim 10, wherein the second substrate is disposed a distance from an upper part of the first substrate.

13. The PCB of claim 10, wherein the signal transmission element is projected along a first direction of the signal transmission element through an opening part formed in a region having a size smaller than a maximum size of the first substrate within the first substrate.

14. A PCB having a mutually distanced structure of first and second substrates through use of a substantially U-shaped signal transmission element, wherein the second substrate is disposed over the first substrate, a first portion of the signal transmission element extends in a first direction from a region of the first substrate, the region having a size smaller than a maximum size of the first substrate within the first substrate, wherein a second portion of the signal transmission element protrudes through an opening portion of the first substrate in a second direction that is different than the first direction, the opening portion adjacent to the region of the first substrate, and wherein a third portion the signal transmission element is extended in a region of the second substrate having a size smaller than a maximum size of the second substrate.

15. The PCB of claim 14, wherein the first and second substrates are formed of a plurality of pattern layers, and any of one or more pattern layers of the first substrate and any of one or more pattern layers of the second substrate are united with the signal transmission element.

16. The PCB of claim 14, wherein the PCB is used in a device selected from an HDD, an SSD and a memory stick.

17. The PCB of claim 15, wherein any of one or more pattern layers of the first substrate, any of one or more pattern layers of the second substrate and the signal transmission element are a flexible printed circuit.

\* \* \* \* \*